United States Patent
Nakamura et al.

(10) Patent No.: US 7,883,998 B2
(45) Date of Patent: Feb. 8, 2011

(54) VAPOR PHASE GROWTH METHOD

(75) Inventors: Masashi Nakamura, Toda (JP); Suguru Oota, Toda (JP); Ryuichi Hirano, Kitaibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 0 days.

(21) Appl. No.: 10/589,733

(22) PCT Filed: Feb. 15, 2005

(86) PCT No.: PCT/JP2005/002222
§ 371 (c)(1),
(2), (4) Date: Mar. 22, 2007

(87) PCT Pub. No.: WO2005/078780
PCT Pub. Date: Aug. 25, 2005

(65) Prior Publication Data
US 2007/0190757 A1    Aug. 16, 2007

(30) Foreign Application Priority Data
Feb. 17, 2004   (JP) .............................. 2004-039177

(51) Int. Cl.
*H01L 21/36* (2006.01)
(52) U.S. Cl. .................. 438/507; 438/566; 438/567; 438/568; 438/569; 438/74; 438/77; 438/81; 438/93; 438/94; 257/443; 257/448; 257/459; 257/461; 257/466
(58) Field of Classification Search ............... 438/507
See application file for complete search history.

(56) References Cited

U.S. PATENT DOCUMENTS

| | | | | |
|---|---|---|---|---|
| 4,357,180 | A * | 11/1982 | Molnar | 438/796 |
| 4,673,446 | A * | 6/1987 | Thompson et al. | 148/33 |
| 4,929,564 | A * | 5/1990 | Kainosho et al. | 438/460 |
| 4,999,315 | A * | 3/1991 | Johnston et al. | 117/102 |
| 5,164,359 | A | 11/1992 | Calviello et al. | |
| 5,219,632 | A * | 6/1993 | Shimakura et al. | 428/64.1 |
| 5,603,765 | A | 2/1997 | Matloubian et al. | |
| 6,022,749 | A | 2/2000 | Davis et al. | |
| 6,214,708 | B1 * | 4/2001 | Iguchi et al. | 438/566 |
| 6,239,354 | B1 * | 5/2001 | Wanlass | 136/249 |
| 6,245,647 | B1 * | 6/2001 | Akiyama et al. | 438/478 |
| 6,257,760 | B1 * | 7/2001 | Davis et al. | 374/185 |

(Continued)

FOREIGN PATENT DOCUMENTS

EP    1 256 988 A2    11/2002

(Continued)

*Primary Examiner*—Fernando L Toledo
*Assistant Examiner*—Ankush K Singal
(74) *Attorney, Agent, or Firm*—Birch, Stewart, Kolasch & Birch, LLP

(57) ABSTRACT

It is to provide a vapor phase growth method in which an epitaxial layer consisting of a compound semiconductor such as InAlAs, can be grown, with superior reproducibility, on a semiconductor substrate such as Fe-doped InP. In vapor phase growth method for growing an epitaxial layer on a semiconductor substrate, a resistivity of the semiconductor substrate at a room temperature is previously measured, a set temperature of the substrate is controlled depending on the resistivity at the room temperature such that a surface temperature of the substrate is a desired temperature regardless of the resistivity of the semiconductor substrate, and the epitaxial layer is grown.

5 Claims, 3 Drawing Sheets

U.S. PATENT DOCUMENTS

| | | |
|---|---|---|
| 6,454,854 B1 * | 9/2002 | Ose .............................. 117/90 |
| 6,475,627 B1 * | 11/2002 | Ose .............................. 428/446 |
| 6,517,235 B2 * | 2/2003 | Zhu et al. ...................... 374/1 |
| 2002/0168856 A1 * | 11/2002 | Iga et al. ...................... 438/689 |
| 2003/0077870 A1 * | 4/2003 | Yoon et al. .................. 438/312 |
| 2003/0186520 A1 * | 10/2003 | Iguchi et al. ................. 438/542 |
| 2004/0069214 A1 * | 4/2004 | Choi et al. .................. 117/213 |
| 2010/0102330 A1 * | 4/2010 | Motoki et al. ................. 257/76 |

FOREIGN PATENT DOCUMENTS

| | | |
|---|---|---|
| JP | 5-74820 A | 3/1993 |
| JP | 5-57849 U | 7/1993 |
| JP | 2002-154896 A | 5/2002 |
| JP | 2003-218033 A | 7/2003 |

* cited by examiner

VAPOR PHASE GROWTH METHOD

DESCRIPTION

1. Technical Field

The present invention relates to a vapor phase growth method for growing an epitaxial layer on a semiconductor substrate. In particular, the present invention relates to a technique for improving a characteristic and a surface morphology of an epitaxial layer.

2. Background Art

Conventionally, semiconductor elements have been widely used, including those provided by growing, on an InP substrate, an epitaxial layer consisting of a compound semiconductor (e.g., InGaAs layer, AlGaAs layer, InAlAs layer, AlInGaAs layer, InGaAsP layer) by the metalorganic chemical vapor deposition (MOCVD) or the molecular beam epitaxy (MBE) for example.

However, when the conventional technique is used to grow an epitaxial layer consisting of a compound semiconductor, e.g., InAlAs, on an InP substrate, there may be a case where a surface of the epitaxial layer has an abnormal morphology. This abnormal morphology is one of causing factors of the deterioration of the element characteristic of a semiconductor element. Thus, an improvement of the morphology of the surface of the epitaxial layer is an important problem to be solved.

For example, the present inventors have proposed a vapor phase growth method by which, in a process for sequentially epitaxially growing an InGaAs layer or an InGaAsP layer and an InP layer on an InP substrate, an abnormal morphology called a crosshatch can be effectively prevented from being generated at the surface of the InP layer (Patent Publication 1). Specifically, a semiconductor wafer having a warpage at the back face of 20 μm or less is used as a substrate to reduce a space between the back face of the semiconductor substrate and a substrate support tool to suppress raw material gas from going to the back face of the substrate, thereby preventing an abnormal morphology from being caused at the surface of the epitaxial layer.

Patent Publication 1: Japanese Patent Unexamined Publication No. 2003-218033

DISCLOSURE OF THE INVENTION

Problem to be Solved by the Invention

However, it was found that, even when the above technique according to the prior application was used to grow an epitaxial layer consisting of a compound semiconductor, e.g. InGaAs layer, AlGaAs layer, InAlAs layer, AlInGaAs layer, on an InP substrate, some substrate causes the epitaxial layer grown on the substrate to have an abnormal characteristic or surface morphology.

The present invention has been made to solve the above problem. An object of the present invention is to provide a vapor phase growth method by which, on a semiconductor substrate such as Fe-doped InP, an epitaxial layer consisting of a compound semiconductor, e.g., InAlAs, can be grown with superior reproducibility.

Means for Solving the Problem

Hereinafter, how the present invention is achieved will be briefly described.

First, the present inventors used the molecular beam epitaxy (hereinafter simply referred to as MBE) to grow an InAlAs layer on various types of Fe-doped InP substrates. Specifically, a plurality of InP wafers were cut out of an Fe-doped InP single crystal manufactured by the Liquid Encapsulated Czochralski and the cut member was used as a substrate. Here a distance (mm) from a position just below a shoulder part of the resultant InP single crystal (body part starting position) is the cutting position of InP wafer. The result showed that some substrate caused the grown epitaxial layer to have an abnormal surface morphology. In other words, it was found that even when substrates cut out of the same InP single crystal are used, the resultant grown epitaxial layers change depending on the cutting position thereof.

Next, in order to investigate a cause of this, Fe-doped InP substrates having different cutting positions were introduced into a single MBE apparatus to subsequently heat the substrates with a single set temperature to directly measure the surface temperatures of the substrates by a pyrometer. The result is shown in FIG. 1. FIG. 1 illustrates a relation between the cutting positions of the substrates from an Fe-doped InP single crystal and surface temperatures of the substrates. In FIG. 1, the □ mark represents a case where a set temperature was 550° C. while the ○ mark represents a case where a set temperature was 600° C.

As can be seen from FIG. 1, regardless of the single set temperature, the surface temperature dramatically changes depending on a cutting position of the substrate. When a substrate cut out from an upper part of the InP single crystal (cutting position: 0 to 10 mm) is used and when a substrate cut out from the lower part (cutting position: 100 to 120 mm) is used in particular, a difference of 20° C. or more was caused in the surface temperature of the substrates. When a substrate having a cutting position of 100 to 120 mm is used, the surface temperature of the substrate was 20 to 30° C. higher than the set temperature.

In the above-described experiment, the surface temperature of the substrate was higher than the set temperature. However, some MBE apparatus may cause the surface temperature of the substrate to be lower than the set temperature. However, this case is also involved with a phenomenon in which the surface temperature changes depending on the cutting position of the substrate.

Next, with regards to substrates cut out from a single Fe-doped InP single crystal, the resistivity and Fe concentration were measured to investigate a relation with the cutting position. FIG. 2 shows a relation between the resistivity and the cutting position. FIG. 3 shows a relation between the Fe concentration and the cutting position. As can be seen from FIGS. 2 and 3, the resistivity and the Fe concentration both change depending on the cutting position from the Fe-doped InP single crystal. Specifically, as shown in FIG. 2, the resistivity gradually increases with an increase of the cutting position and is almost constant when the cutting position is 100 mm or more. As shown in FIG. 3, the Fe concentration gradually increases with an increase of the cutting position and remarkably increases when the cutting position is 100 mm or more.

When these measurement results are compared with FIG. 1, the change to the cutting position is almost the same as those of FIG. 1 and FIG. 2. Thus, it can be said that the surface temperature of the substrate has a correlation with a resistivity of the substrate, not with the Fe concentration. This is presumably caused because, when the substrate is heated in vacuum as in the MBE method, an influence by the radiation is dominant and thus the substrate resistivity has an influence on the surface temperature of the substrate.

Thus, the present invention was achieved by finding that, based on the relation between the substrate resistivity and the surface temperature, an actual surface temperature of the substrate can be a desired temperature by adjusting a set temperature depending on a previously-measured substrate resistivity, thus stabilizing the quality of an epitaxial layer to be grown.

That is, according to the present invention, a vapor phase growth method for growing an epitaxial layer on a semiconductor substrate, comprises: previously measuring a resistivity of the semiconductor substrate at a room temperature; controlling a set temperature of the substrate depending on the resistivity at the room temperature such that a surface temperature of the substrate is a desired temperature regardless of the resistivity of the semiconductor substrate; and growing the epitaxial layer. Furthermore, the surface temperature of the substrate changes depending on the thickness of the substrate or a heating method. Thus, if a relation between a set temperature for a resistivity of the semiconductor substrate and an actual surface temperature of the substrate with regards to each of them is found, a temperature for allowing the surface temperature of the substrate to be a desired temperature can be set easily.

Furthermore, the semiconductor substrate can be a compound semiconductor such as InP or Fe-doped InP. When an InP substrate or an Fe-doped InP substrate is used, an epitaxial layer to be grown may be the one that may have a favorable lattice matching with InP, such as InGaAs, AlGaAs, InAlAs, AlInGaAs, InGaAsP.

The above-described vapor phase growth may use the molecular beam epitaxy.

Effect of the Invention

According to the present invention, in a process for subjecting an epitaxial layer consisting of a compound semiconductor, e.g., InAlAs layer, to a vapor phase growth on a semiconductor substrate, e.g., Fe-doped InP, the change of the substrate temperature due to the substrate resistivity is considered and the substrate temperature is appropriately set to fix the substrate temperature at a desired temperature. This provides an effect in which the epitaxial layer having a stable quality can be grown with superior reproducibility and a semiconductor element having superior characteristic can be manufactured stably.

BEST MODE FOR CARRYING OUT THE INVENTION

Hereinafter, preferred embodiments of the present invention will be described with reference to the drawings.

First, Liquid Encapsulated Czochralski (LEC) was used to grow an Fe-doped InP single crystal material in a direction of (100). Then, this Fe-doped InP single crystal was processed to have a cylindrical shape having a diameter of 2 inches. Then, Fe-doped InP wafers having a thickness of 350 μm were cut out.

Figure 4:
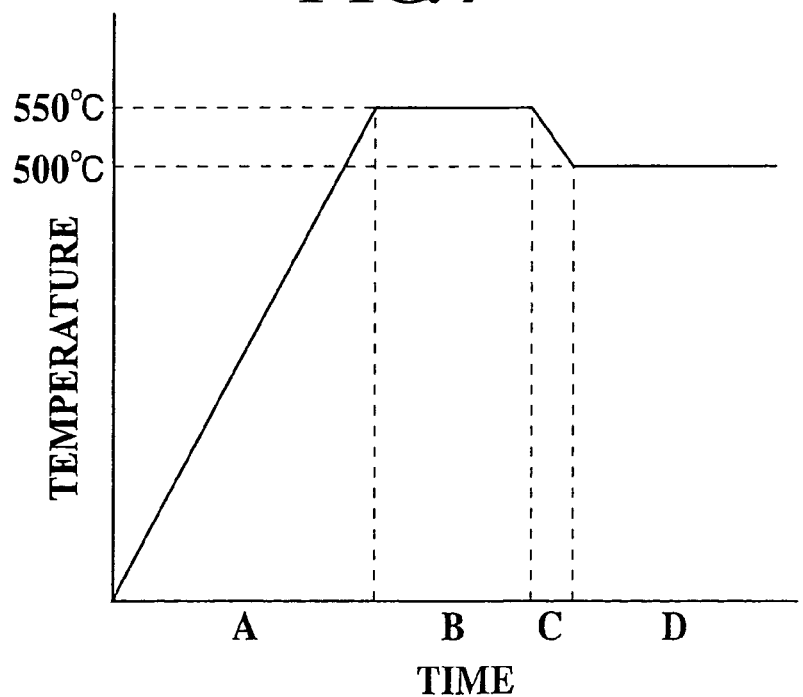
[FIG. 4] This illustrates a temperature profile in a vapor phase growth in an embodiment.

Then, on these substrates, undoped InAlAs layers were grown by the MBE method. FIG. 4 illustrates the temperature profile until the growth according to this embodiment is reached. As shown in FIG. 4, a substrate was subjected to a thermal cleaning processing with 550° C. before an InAlAs layer is grown. Thereafter, an undoped InAlAs layer was epitaxially grown on the substrate to have a thickness of 1 μm with a set temperature of 500° C. The thermal cleaning processing was performed for 5 minutes and the undoped InAlAs layer was grown for 60 minutes.

In this embodiment, various Fe-doped InP substrates having different cutting positions were measured with regards to the substrate resistivities at a room temperature. Based on the substrate resistivities, a set temperature was adjusted so that an actual substrate temperature was fixed at a desired temperature to perform a thermal cleaning processing and the growth of the undoped InAlAs layer. Specifically, when an Fe-doped InP substrate having a substrate resistivity at a room temperature of about $1 \times 10^8 \Omega \cdot cm$ was used, a set temperature of the substrate for a thermal cleaning processing was determined as 530° C. and a set temperature of the substrate for the growth of the undoped InAlAs layer was determined as 480° C., thereby controlling the substrate temperature to be a desired temperature.

It is noted that, this temperature setting is effective in this embodiment and a set temperature may be different depending on a factor such as an MBE apparatus to be used or a thickness of a substrate. In other words, a surface temperature of a substrate changes depending on a thickness of the substrate or a heating method. Thus, if a relation between a set temperature to a resistivity of a semiconductor substrate at a room temperature and an actual surface temperature of the substrate is found, a set temperature for allowing the surface temperature of the substrate to be a desired temperature can be determined easily. For example, set temperatures in this embodiment are respectively set 20° C. lower in order to allow the substrate temperature to be a desired temperature (550° C. or 500° C.). However, a set temperature also may be set, contrary to the above case, to be higher than a desired temperature depending on an MBE apparatus to be used.

On the other hand, a plurality of Fe-doped InP substrates having the same resistivity as the above-described one were used for comparison to perform a thermal cleaning processing and a growth of an undoped InAlAs layer under conditions in which a set temperature of the substrate was fixed (550° C. at the thermal cleaning processing and 500° C. at the growth of the undoped InAlAs).

With regards to the semiconductor element obtained by the above-described method, the surface morphology of the undoped InAlAs layer was observed. The result showed that, when the set temperature was adjusted depending on the resistivity at a room temperature and an actual surface temperature of the substrate during the thermal cleaning processing was retained at 550° C., the surface of the undoped InAlAs layer was not rough and a favorable epitaxial layer could be grown.

Figure 1:
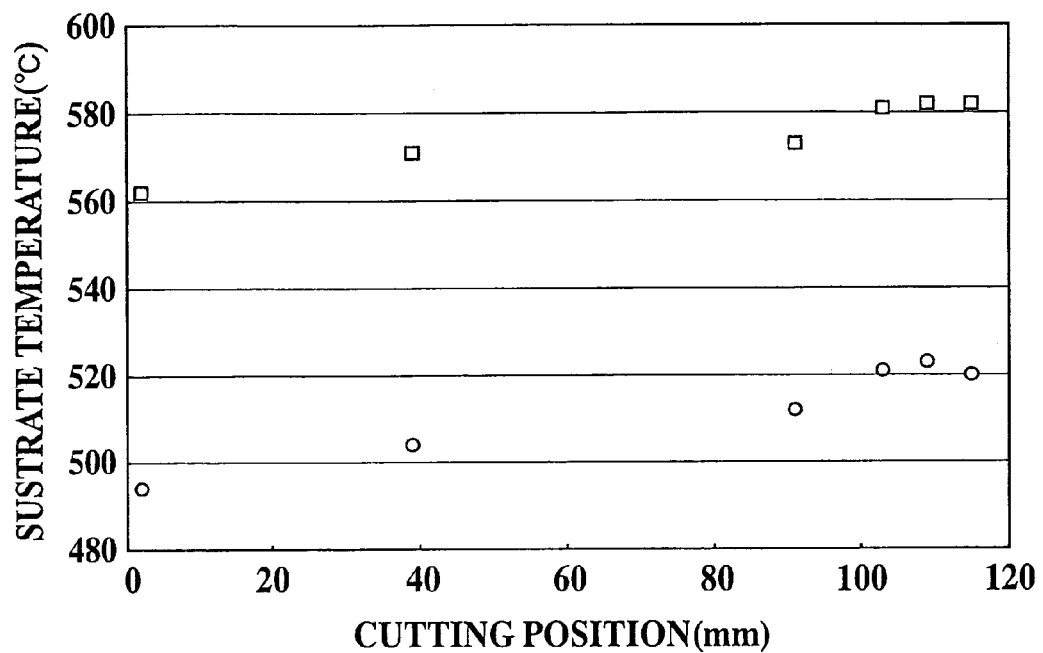
[FIG. 1] This is a graph illustrating a relation between a cutting position from an InP single crystal and a surface temperature of a substrate.
Figure 2:
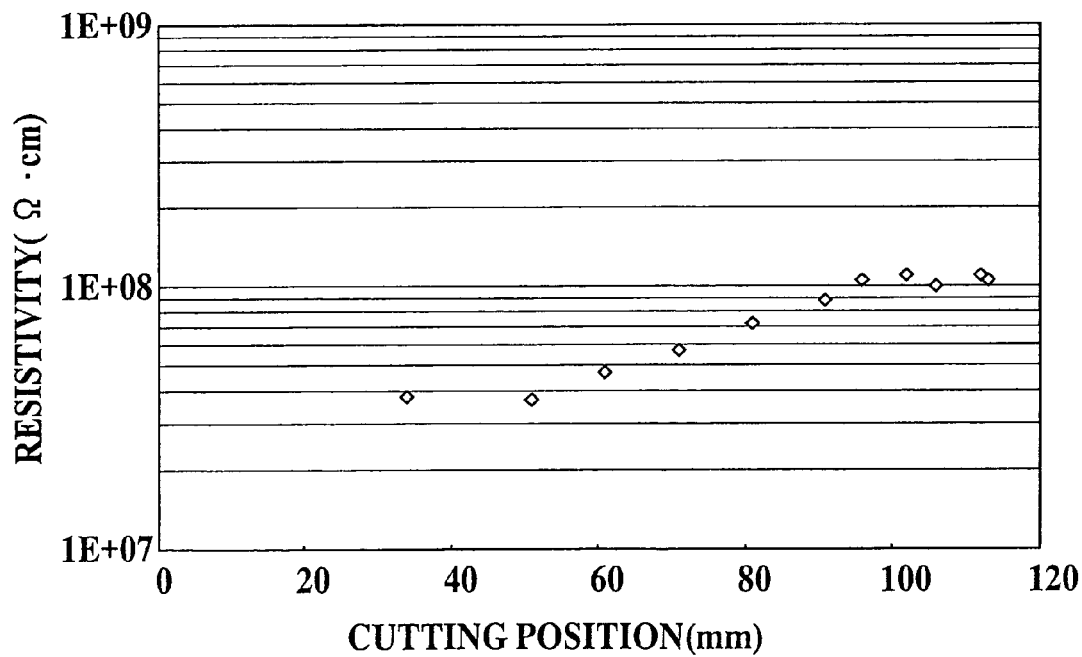
[FIG. 2] This is a graph illustrating a relation between a cutting position from an InP single crystal and a resistivity of the substrate.
Figure 3:
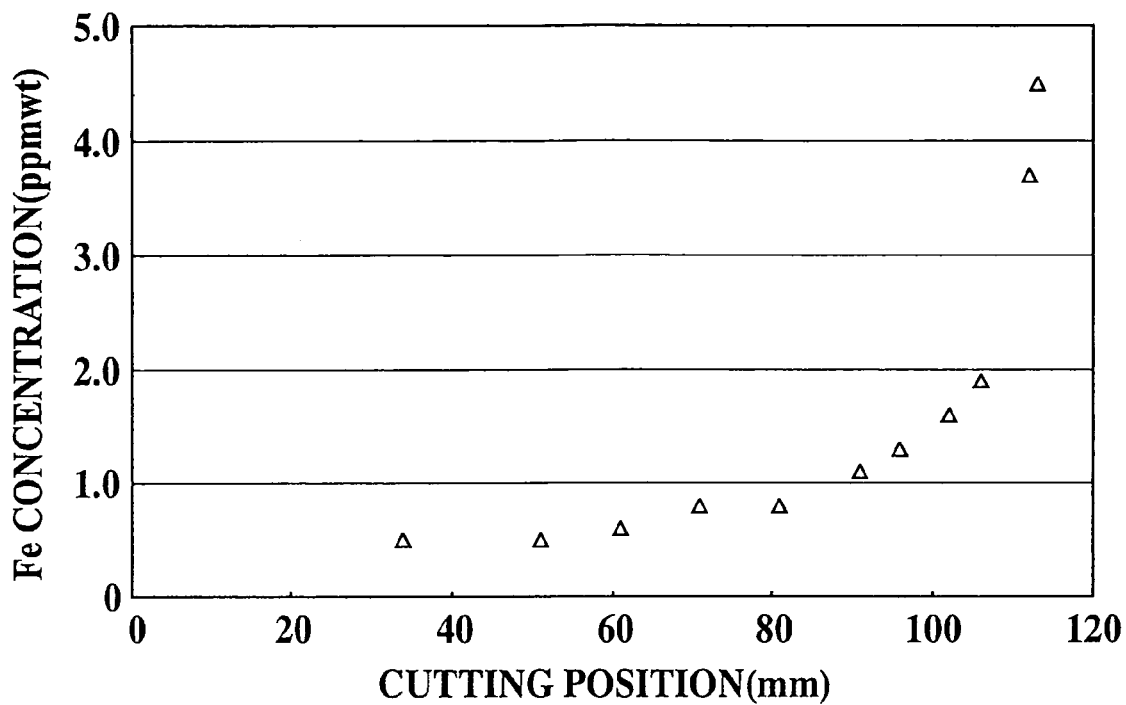
[FIG. 3] This is a graph illustrating a relation between a cutting position from an InP single crystal and an Fe concentration of the substrate.

When the set temperature was fixed at 550° C. on the other hand, the surface of the undoped InAlAs layer was rough. This is presumably caused because the surface temperature of the substrate was much higher than the set temperature (550° C.) during the thermal cleaning processing and thus the substrate surface became rough. When a substrate having a resistivity at a room temperature of $1\times10^8 \Omega\cdot cm$ was used in particular, a difference between the set temperature and an actual surface temperature of the substrate was increased (see FIGS. 1 and 2). Thus, the above-described phenomenon clearly appeared.

The obtained semiconductor elements were measured with regards to the resistivity of the undoped InAlAs layer. The result showed that, when a substrate having a resistivity at a room temperature of $1\times10^8 \Omega\cdot cm$ was used and the set temperature was adjusted depending on the resistivity and an actual surface temperature of the substrate during the growth of the undoped InAlAs layer was maintained at 500° C., resistivities of the undoped InAlAs layer were all equal to or higher than $1\times10^6 \Omega\cdot cm$, thus realizing a high resistivity.

When the set temperature was fixed on the other hand, the resistivity of the undoped InAlAs layer, which was equal to or higher than $1\times10^6 \Omega\cdot cm$ in the above embodiment, lowered to $5\times10^4 \Omega\cdot cm$. This was presumably caused due to a temperature dependency of the resistivity of the undoped InAlAs layer.

Figure 5:
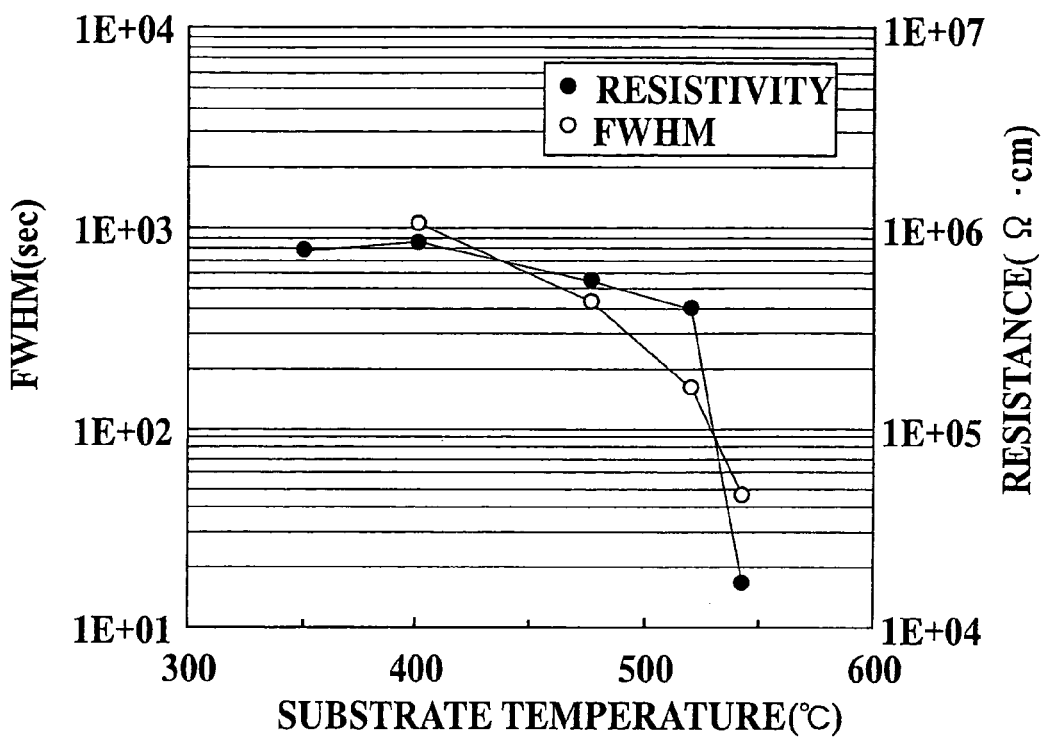
[FIG. 5] This is a graph illustrating a temperature dependency of a resistivity of an InAlAs layer.

For example, an experiment by the present inventors showed that the resistivity of an InAlAs layer showed the temperature dependency as shown in FIG. 5. As can be seen from FIG. 5, the resistivity of the InAlAs layer remarkably lowers when the substrate temperature during the growth is 520° C. or more. In other words, in the comparison example, regardless of the set temperature of the substrate during the growth of the undoped InAlAs layer of 500° C., an actual substrate temperature increased to a value equal to or higher than 520 ° C. It is noted that the graph shown in FIG. 5 is the one regarding an InAlAs layer grown by growth conditions different from those of this embodiment. Thus, an absolute value of the resistivity of the InAlAs layer is not always equal to that of this embodiment.

Next, the same Fe-doped InP substrates as the above-described substrate were used and Si-doped InAlAs layers were grown on these substrate by the MBE method. During the growth, Si was doped in an amount through which a doping concentration of $2\times10^{19} cm^{-3}$ was obtained and the growth conditions were the same as the above-described conditions for the undoped InAlAs. For comparison, a plurality of Fe-doped InP substrates having the same resistivity of the above one were used and a thermal cleaning processing and the growth of an Si-doped InAlAs layer were performed under conditions in which a set temperature of the substrate was fixed.

With regards to the obtained semiconductor element, an Si doping concentration (carrier concentration) of the Si-doped InAlAs layer was measured. The result showed that, when substrates having a resistivity at a room temperature equal to or higher than $1\times10^8 \Omega\cdot cm$ were used and a set temperature was adjusted depending on the resistivity and an actual surface temperature of the substrates during the growth of the InAlAs layer was maintained at 500° C., all Si dope concentrations of the Si dope InAlAs layers were $2\times10^{19} cm^{-3}$.

When the set temperature was fixed on the other hand, the Si doping concentration lowered to $1\times10^{19} cm^{-3}$. This is presumably caused by the temperature dependency of the Si doping efficiency of the Si-doped InAlAs layer.

Figure 6:
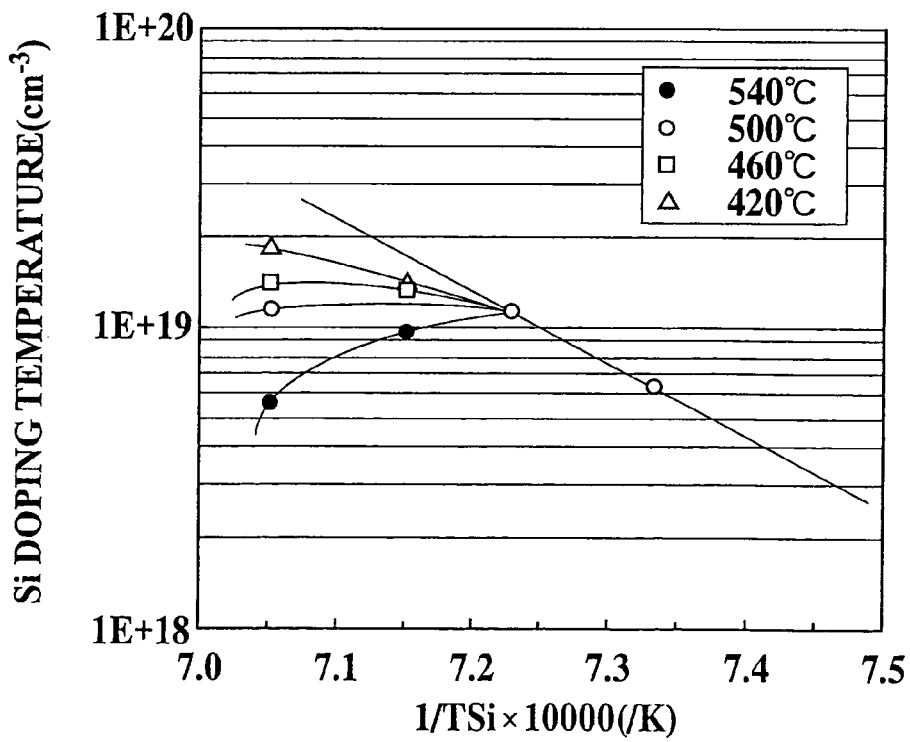
[FIG. 6] This is a graph illustrating a temperature dependency of a Si doping efficiency of an InAlAs layer.

For example, an experiment by the present inventors shows that the Si doping efficiency of the InAlAs layer shows a temperature dependency as shown in FIG. 6. As can be seen from FIG. 6, the Si doping concentration of the InAlAs layer lowers when the substrate temperature during the growth is 500° C. or more. In other words, in spite of the set temperature of the substrate during the growth of the Si-doped InAlAs layer of 500° C. in the comparison example, an actual substrate temperature presumably increased to a value of 500° C. or more.

As described above, in a process for subjecting an epitaxial layer consisting of an undoped InAlAs or an Si-doped InAlAs to a vapor phase growth on an Fe-doped InP substrate, a resistivity of the semiconductor substrate at a room temperature is previously measured to control the set temperature of the substrate depending on the resistivity of the semiconductor substrate. As a result, a surface morphology, resistivity and doping concentration of a grown epitaxial layer could be improved and thus an epitaxial layer having a stable quality could be grown with a superior reproducibility.

As described above, the invention made by the present inventors has been specifically described based on embodiments. However, the present invention is not limited to the above embodiments and can be changed in a range not departing from the gist thereof.

For example, although this embodiment has described an example in which the MBE method was used to grow an InAlAs layer on an Fe-doped InP substrate, a growth method for growing an epitaxial layer such that a surface temperature changing depending on the resistivity is fixed can provide the same effect regardless of the type of the grown epitaxial layer. The present invention is not limited to a substrate or a growth method to be used, as can be seen from the above-described description.

The invention claimed is:

1. A reproducible vapor phase growth method for growing an epitaxial layer on semiconductor substrates of a single crystal, comprising:

measuring a resistivity of arbitrary semiconductor substrates at a room temperature;

obtaining respectively a relationship between a heating temperature and a temperature of a surface of the arbitrary semiconductor substrates, for the arbitrary semiconductor substrates having different resistivities, the relationship depending on different cutting positions of the single crystal;

setting and adjusting said heating temperature of a semiconductor substrate to be used based on (i) a measured resistivity of the semiconductor substrate to be used and (ii) the obtained relationship between the heating temperature and the temperature of the surface of said semiconductor substrate; and growing the epitaxial layer, wherein the temperature of said surface of said semiconductor substrate to be used is indirectly controlled by adjusting said heating temperature.

2. The vapor phase growth method as claimed in claim 1, wherein the semiconductor substrate is a compound semiconductor.

3. The vapor phase growth method as claimed in claim 2, wherein the semiconductor substrate is an InP substrate.

4. The vapor phase growth method as claimed in claim 3, wherein the semiconductor substrate is an Fe-doped InP substrate.

5. The vapor phase growth method as claimed in any of claims 1 to 4, wherein a molecular beam epitaxy is used to grow an epitaxial layer.

* * * * *